United States Patent
Lu et al.

(10) Patent No.: US 7,589,033 B2
(45) Date of Patent: Sep. 15, 2009

(54) FABRICATION OF WAFER-LEVEL TEST MODULE FOR TESTING IMAGE SENSOR CHIPS

(75) Inventors: Sheng-Feng Lu, Hsin-Chu (TW); Wei-Hua Lee, Hsin-Chu (TW)

(73) Assignee: Visera Technologies, Company Ltd., Hsin-Chu (TW)

( * ) Notice: Subject to any disclaimer, the term of this patent is extended or adjusted under 35 U.S.C. 154(b) by 0 days.

(21) Appl. No.: 12/219,087

(22) Filed: Jul. 16, 2008

(65) Prior Publication Data
US 2008/0280382 A1    Nov. 13, 2008

Related U.S. Application Data

(62) Division of application No. 11/730,813, filed on Apr. 4, 2007, now Pat. No. 7,414,423.

(30) Foreign Application Priority Data
Dec. 12, 2006    (TW) .............................. 95146509 A

(51) Int. Cl.
    *H01L 21/00*    (2006.01)
(52) U.S. Cl. ..................................... 438/800
(58) Field of Classification Search .................. 438/800
    See application file for complete search history.

(56) References Cited
U.S. PATENT DOCUMENTS
2006/0284631 A1 *    12/2006    Hamren ...................... 324/761

* cited by examiner

*Primary Examiner*—Evan Pert
(74) *Attorney, Agent, or Firm*—Bacon & Thomas, PLLC

(57) ABSTRACT

A wafer-level test module is disclosed to include a base layer having multiple first apertures spaced from one another at a pitch corresponding to the pitch of the image sensor chips of an integrated circuit wafer, a cover layer having second apertures respectively axially aimed at the first apertures, and an optical layer sandwiched between the base layer and the cover layer having multiple optical lenses of which the optical axes pass through the first apertures and the second apertures, so that when one image capturing device of the image sensor chips of an integrated circuit wafer is adjusted to the image plane of one of the optical lenses and the wafer-level test module is set in alignment with the integrated circuit wafer horizontally and vertically, then the effective test light can be simultaneously projected onto the image capturing devices of the respective image sensor chips through the wafer-level test module to achieve an effective wafer-level test on multiple image sensor chips of the integrated circuit wafer accurately and rapidly.

5 Claims, 4 Drawing Sheets

FABRICATION OF WAFER-LEVEL TEST MODULE FOR TESTING IMAGE SENSOR CHIPS

CROSS REFERENCES TO THE RELATED APPLICATIONS

This application is a divisional application of pending of U.S. patent application Ser. No. 11/730,813, filed Apr. 4, 2007, now allowed (of which the entire disclosure of the pending, prior application is hereby incorporated by reference).

BACKGROUND OF THE INVENTION

1. Field of the Invention

The present invention relates to a wafer-level test system and more particularly, to a wafer-level test module for testing image sensor chips of an integrated circuit wafer. The invention relates also to a wafer-level test method of image sensor chips using the wafer-level test module.

2. Description of the Related Art

Electronic devices fabrication must proceed some steps of test engineering respectively corresponding to the specific processing steps, especially for package-level test engineering after the wafer-level manufacturing and product test engineering before the final product modularization. Under the severe market competition, every manufactory emphasizes high-performance wafer-level test methods to effectively save packaging process for package-level test and control the quality of main process steps. Therefore, a complete wafer-level test system is an important test engineering to every manufactory.

A camera built inside the cell phone, PDA, leg-top computer, or any other portable electronic product is commonly formed of an image sensor module, which comprises a set of optical lens and an image sensor chip made subject to an integrated circuit process. When the set of optical lens projects the image on the image sensor chip, the circuit of the image sensor chip is operated to capture the image and store the image data in the portable electronic product. As a result, the electrical characteristics of the image sensor chip are highly photo-electronic related. Therefore, the wafer-level test engineering of an image sensor chip during the manufacturing process is important to the inspection of the electrical characteristics of the image sensor chip.

Even the wafer-level test on integrated circuit electronic devices has been well developed, when considering both the optical sensing technology and the circuit operation of the image sensor chip, there is still no any perfect wafer-level test system for testing multiple image sensor chips of an integrated circuit wafer accurately and rapidly. FIG. 1 illustrates a conventional test apparatus 1 of image sensor chips. This test apparatus 1 is comprised of a probe card 11 and a lens set 12. The lens set 12 is installed in the non-test circuit zone at the center of the probe card 11, and comprised of four optical lenses 120 and a lens mount 121. The lens mount 121 holds the optical lenses 120 in the probe card 11, allowing adjustment of every optical lens 120 to focus the incident light on a respective image sensor chip. The probe card 11 provides test signals to the respective image sensor chips then obtains each feedback test result from each of the image sensor chips respectively focused by the optical lenses 120. In view of the dimensional structure of an IC process, the dimension of one single optical lens 120 covers several image sensor chips in an integrated circuit wafer, however, only an image capturing device of the image sensor chip that is aligned with the optical axis of the respective optical lens 120 can receive an effective optical image, and the other circuit devices of the image sensor chip beyond the optical axis of the optical lens 120 cannot induce photo-electronic characteristics. As shown in FIG. 2, a standard integrated circuit wafer with 200 mm diameter has more than fifty or sixty unit chips. However, the lens set 12 simply covers a limited number of the unit chips (X-marked blocks in FIG. 2). Completing an electrical test engineering on the integrated circuit wafer which is integrated with image sensor chips needs to repeat more than ten times of the calibration procedure to align the optical axis of every optical lens 120 with an image capturing device of the respective image sensor chip. This test procedure is not a time-effective method. Further, it is difficult to control the optical precision when making optical axis alignment of the relatively larger size of the optical lenses 120 with the micro-sized image capturing devices of the corresponding image sensor chips.

SUMMARY OF THE INVENTION

The present invention has been accomplished under the circumstances in view. It is the main object of the present invention to provide an wafer-level test module, which can make a wafer-level test on image sensor chips of an integrated circuit wafers accurately and rapidly.

To achieve this and other objects of the present invention, the invention provides a wafer-level test module comprised of a base layer, an optical layer, and a cover layer. The fabrication of the test module comprises the steps of:

a) preparing a first wafer and making multiple first apertures on the first wafer to form a base layer, wherein the first apertures are spaced from one another at a pitch equal to the pitch of the image sensor chips of the integrated circuit wafer; when light passes through the first apertures in the normal direction, it is projected onto each image sensor chip of the integrated circuit wafer to be tested;

b) preparing a second wafer and making multiple through holes on the second wafer corresponding to the first apertures on the first wafer, which through holes having a diameter slightly greater than the first apertures;

c) preparing multiple optical lenses each having an outer diameter equal to the diameter of the through holes on the second wafer, and mounting the optical lenses in the through holes respectively to keep the optical axes of the optical lenses in vertical relative to the wafer plane of the second wafer and to let the optical axes of the optical lenses pass through the centers of the through holes respectively so as to form an optical layer;

d) preparing a third wafer and making a plurality of second apertures on the third wafer corresponding to the first apertures to form a cover layer; and e) stacking the base layer, the optical layer and the cover layer on one another to let the optical axes of the optical lenses pass through the first apertures and the second apertures in the normal direction.

When an effective test light is projecting onto the second apertures in the normal direction above the wafer-level test module, the optical lenses focus the light through the first apertures on the image plane. When one image capturing device of the image sensor chips of an integrated circuit wafer is adjusted to the image plane of one of the optical lenses, the wafer-level test module is set in alignment with the integrated circuit wafer horizontally and vertically, the effective test light can be simultaneously projected onto the image capturing devices of the respective image sensor chips in the integrated circuit wafer through the wafer-level test module to achieve an effective wafer-level test on multiple image sensor chips of the integrated circuit wafer accurately and rapidly.

The invention further provides a wafer-level test system for testing multiple image sensor chips of an integrated circuit wafer. The wafer-level test system comprises a probe card and a wafer-level test module. The probe card comprises a detection zone and a circuit zone. The detection zone is a center opening of the probe card. The circuit zone comprises a plurality of electronic circuits arranged thereon, and a plurality of probes suspending beneath the detection zone. The probes are perfect conductors for probing the image sensor chips of the integrated circuit wafer to electrically connect the electronic circuits of the circuit zone to the image sensor chips. The wafer-level test module mounted in the detection zone of the probe card, and made subject to the size of the detection zone. Therefore, when the test module is set in accurate alignment with image sensor chips of one integrated circuit wafer, it can make an wafer-level test on multiple image sensor chips of the integrated circuit wafer accurately and rapidly. The test method includes the steps of:

a) preparing an integrated circuit wafer having a plurality of image sensor chips, the image sensor chips each comprising an image capturing device electrically connected to at least one test pad of the respective image sensor chip;

b) putting the wafer-level test system on the integrated circuit wafer to aim the detection zone of the probe card at multiple image capturing devices of the integrated circuit wafer;

c) providing a test light projecting from a top side above the wafer-level test system onto the detection zone and the integrated circuit wafer;

d) adjusting horizontal alignment and vertical distance between the wafer-level test system and the integrated circuit wafer to let the optical lenses focus the projected test light on the respective image capturing devices; and e) electrically connecting the probes of the probe card to the test pads of the image sensor chips of the integrated circuit wafer.

f) connecting the electronic circuits of the probe card to a test machine for enabling the test machine to receive photoelectrical signals from the respective image capturing devices of the image sensor chips so as to finish the wafer-level test on the image capturing devices in one sector block of the integrated circuit wafer;

g) moving the integrated circuit wafer horizontally to let the test module be aimed at the other sector blocks of the integrated circuit wafer and then repeating the above steps to finish the wafer-level test on the image sensor chips in the other sector blocs of the integrated circuit wafer.

DETAILED DESCRIPTION OF THE INVENTION

Figure 1:
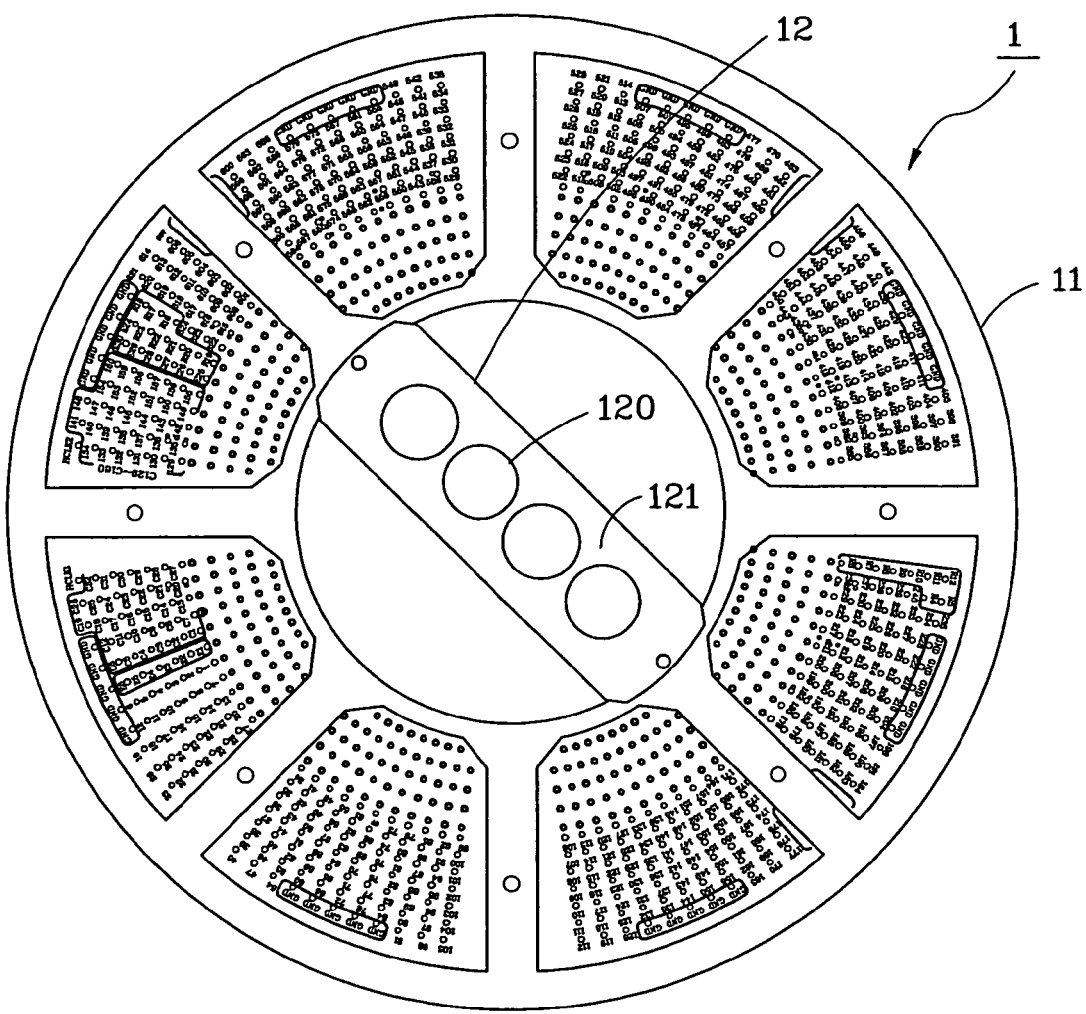
FIG. 1 is a schematic top view of an image sensor chip test apparatus according to the prior art.
Figure 2:
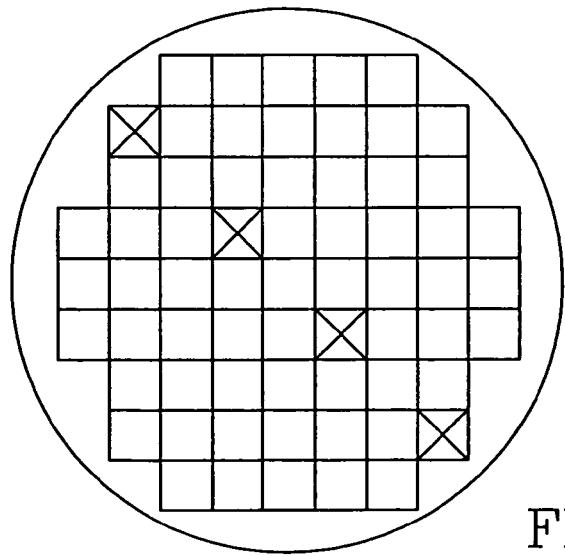
FIG. 2 is a schematic drawing illustrating the distribution of one test block of image sensor chips of an integrated circuit wafer corresponding to the optical lenses of the optical lens set of the image sensor chip test apparatus according to the prior art.
Figure 3:
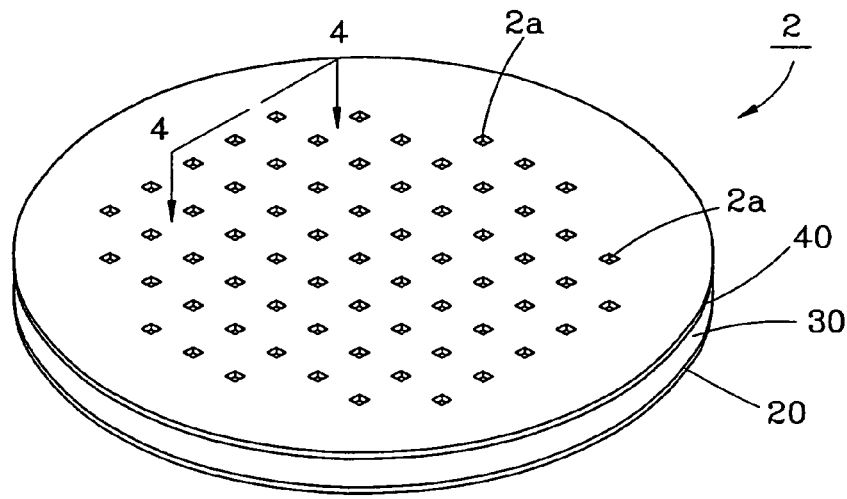
FIG. 3 is an elevational view of a wafer-level test module in accordance with a first embodiment of the present invention.
Figure 4:
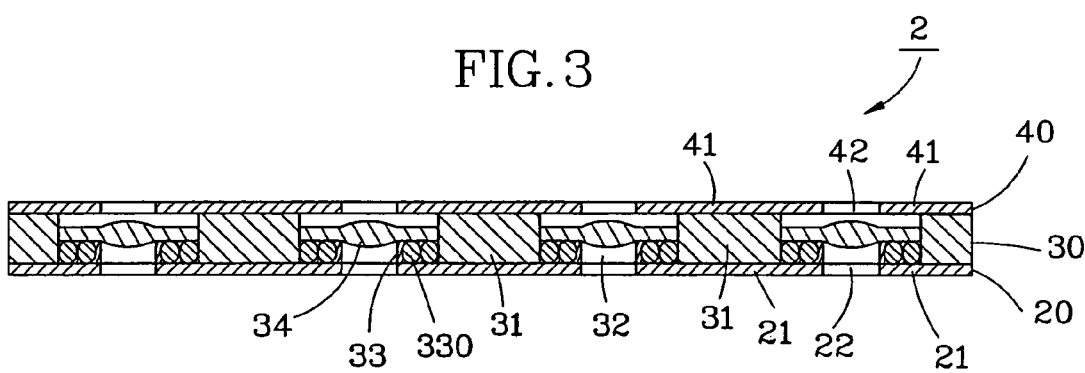
FIG. 4 is a sectional view taken along line 4-4 of FIG. 3.
Figure 5:
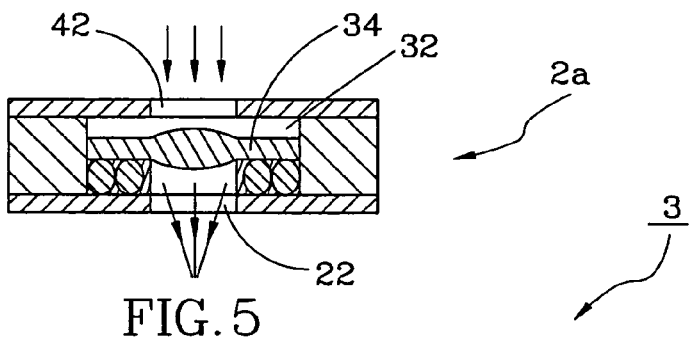
FIG. 5 is a schematic drawing of a part of the first embodiment of the present invention, illustrating the structure of one optical test device.

Referring to FIGS. 3~5, a wafer-level test module 2 in accordance with a first embodiment of the present invention is shown, constituting a plurality of optical test devices 2a made from a silicon based substrate. The dimensional structure of each of the optical test devices 2a corresponds to an image sensor chip of an integrated circuit wafer manufactured by Solid-State Image Sensor technology, so that the pitch among the optical test devices 2a is equal to the pitch among the image sensor chips of the integrated circuit wafer. The wafer-level test module 2 has a multi-layer structure comprising from the bottom to the top a base layer 20, an optical layer 30, and a cover layer 40.

The base layer 20 uses a first wafer 21 as the substrate. The first wafer 21 is processed to provide multiple first apertures 22, each of which corresponds to an image capturing device of each image sensor chip, so that light passing forwardly through the first apertures 22 is projected onto each image capturing device.

The optical layer 30 uses a second wafer 31 as the substrate. The second wafer 31 is processed to provide multiple through holes 32 corresponding to the first apertures 22 of the base layer 20. The through holes 32 have a diameter greater than the first aperture 22. The second wafer 31 is stacked on the base layer 20, keeping the through holes 32 in axial alignment with the apertures 22 respectively. A spacer layer 33 is then applied to the inside wall of each through hole 32. The spacer layer 33 is formed of a printed coating process prepared by mixing a plurality of spacer particles 330 with an adhesive fluid at a low volume ratio. The spacer particles 330 have a same particle size and the diameter is much smaller than the thickness of the second wafer 31, so that the height of the spacer layer 33 is determined subject to the thickness of the spacer particles 330. Thereafter, an optical lens 34 is respectively fitted into each through hole 32 and bonded to the spacer layer 33. Therefore, the spacer layer 30 secures the optical lenses 34 firmly in the associating through holes 32, and the size of the spacer particles 330 is selected to control the horizontal location of the planar axis of the optical lens 34, thereby determining the effective location of the forming image projected by the optical layer 30.

The cover layer 40 uses a third wafer 41 as the substrate. The third wafer 41 is processed to provide a plurality of second apertures 42 corresponding to the first apertures 22. The diameter of the second apertures 42 is equal to the first apertures 22. The third wafer 41 is stacked on the optical layer 30, keeping the second apertures 42 in axial alignment with the first apertures 22 respectively. Therefore, the optical axis of each optical lens 34 passes in the normal direction through the center of the associating first aperture 22 and the center of the associating second aperture 42, and the diameter of the second apertures 42 determines the effective aperture size of the light passing through the optical lenses 34.

After the aforesaid modularization, optical test devices 2*a* are formed in the wafer-level test module 2. As shown in FIG. 5, when an effective test light is incident downwardly into the optical test devices 2*a* through the second apertures 42 in the normal direction, the optical lenses 34 focus the light through the first apertures 22 and projects onto the image plane. As long as one image capturing device of the image sensor chips on the integrated circuit wafer is adjusted to the image plane of one optical lens 34, and the wafer-level test module 2 is set in alignment with the integrated circuit wafer horizontally and vertically, then the effective test light can be simultaneously projected onto the image capturing devices of the respective image sensor chips on the integrated circuit wafer through the optical test devices 2*a*. Additionally providing with a probe station of the regular semiconductor wafer-level test machine to operate the probing test on the image sensor chips, it can simply achieve an effective wafer-level test on multiple image sensor chips of an integrated circuit wafer accurately and rapidly.

Figure 6:
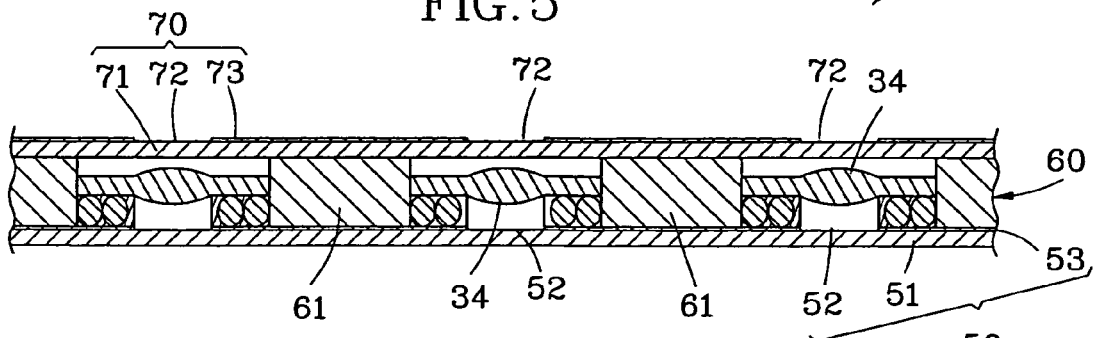
FIG. 6 is a schematic sectional view of a part of a wafer-level test module in accordance with a second embodiment of the present invention.

The substrate material of each of the aforesaid first, second and third wafers 21, 31 and 41 for the wafer-level test module 2 is a silicon based material subject to the considerations of manufacturing convenience, substrate supporting strength, and capable of blocking incident light. However, material selection is not limited to the silicon substrate for use in semiconductor fabrication. FIG. 6 illustrates a wafer-level test module 3 in accordance with a second embodiment of the present invention. According to this embodiment, the substrates of the wafer-level test module 3 are selected from transparent glass panels. As illustrated, the wafer-level test module 3 is a multi-layer structure comprising from the bottom to the top a base layer 50, an optical layer 60, and a cover layer 70. Each of the base layer 50, the optical layer 60, and the cover layer 70 has a substrate structure respectively prepared from a first, second and third panel 51, 61, and 71. The manufacturing method and composition of the optical layer 60 are the same as the optical layer 30 of the wafer-level test module 2 of the aforesaid first embodiment. The base layer 50 and the cover layer 70 utilize the characteristic of good transparency of transparent glass panel and made subject to the manufacturing process of a regular display panel.

Each of the first panel 51 and the third panel 71 of the respective base layer 50 and cover layer 70 is coated with a predetermined thickness of a thin film material made of black photoresist that is capable of absorbing light and is opaque. By means of photolithography processing, a part of the thin film materials stacked respectively on the first panel 51 and the third panel 71 corresponding to the optical lenses 34 of the optical layer 60 are removed, and therefore a transparent array constituted by a plurality of first apertures 52 is formed on the first panel 51, and a transparent array constituted by a plurality of second apertures 72 is formed on the third panel 71, and the residues of the thin film materials are formed an absorption layer 53 and 73 respectively on the first panel 51 and the third panel 71. Thus, the desired first apertures 52 and second apertures 72 of good transparency are respectively formed on the first panel 51 and the third panel 71.

The wafer-level test module 3 of this second embodiment not only has the functional characteristics of the wafer-level test module 2 of the aforesaid first embodiment but also eliminate the process of making through holes on the first and third panels 51 and 71, which effectively saving the manufacturing cost and well protecting the optical lenses 34 of the optical layer 60 against contamination by the environments. Because of the material properties of the first, second and third panels 51, 61, and 71 enabling the first and second apertures 52 and 72 to have good transparency, also because of the materials and their respective manufacturing process of the panels 51, 61, and 71 and the absorption layers 53 and 73 preventing from unnecessary image projection induced by environmental noises and optical interference with the effective test light transmitted through the optical lenses 34, this second embodiment can gain with quality of module engineering and photo-electrical test quality corresponded by effectively projected optical image. Therefore, this embodiment achieves the designed efficiency of the present invention.

Figure 7:
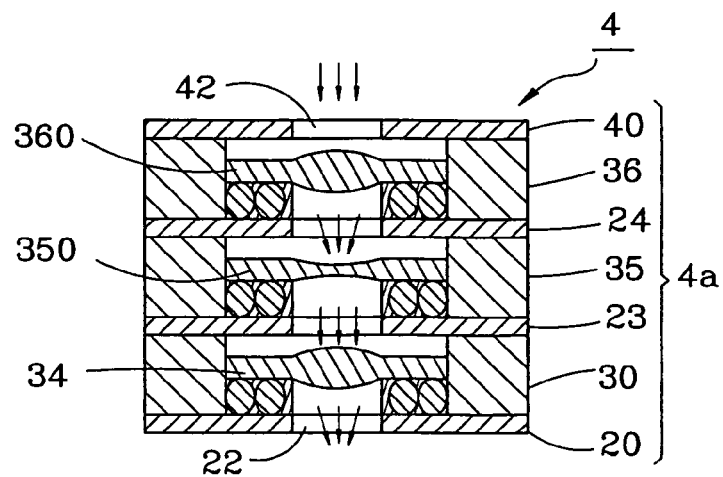
FIG. 7 is a schematic sectional view of a part of a wafer-level test module in accordance with a third embodiment of the present invention.

Also the wafer-level test module of this invention is not limited to the single optical layer 30 or 60 in the aforesaid first or second embodiments. Considering other optical test conditions, the invention provides the third embodiment of a wafer-level test module 4 as shown in FIG. 7. Inclusive of the base layer 20, the optical layer 30 and the cover layer 40 of the wafer-level test module 2 of the aforesaid first embodiment, the wafer-level test module 4 further provides between the optical layer 30 and the cover layer 40 upwardly with a second base layer 23, a second optical layer 35, a third base layer 24, and a third optical layer 36. The second base layer 23 and the third base layer 24 have the same functional structure of the base layer 20. The second optical layer 35 has a plurality of second optical lenses 350 respectively arranged in axial alignment with the optical lenses 34 of the optical layer 30. The third optical layer 36 has a plurality of third optical lenses 360 respectively arranged in axial alignment with the optical lenses 350 of the second optical layer 35 and the optical lenses 34 of the optical layer 30.

When an effective test light is incident downwardly into the optical test devices 4*a* through the second apertures 42 in the normal direction, the optical lenses 360, 350 and 34 of the optical layers 36, 35 and 30 focus the light through the first apertures 22 and project onto the image plane. Employing with the abovementioned wafer alignment procedure and probing test on an wafer-level test machine, the wafer-level test module 4 can achieve an effective wafer-level test on the multiple image sensor chips of one integrated circuit wafer rapidly.

Figure 8:
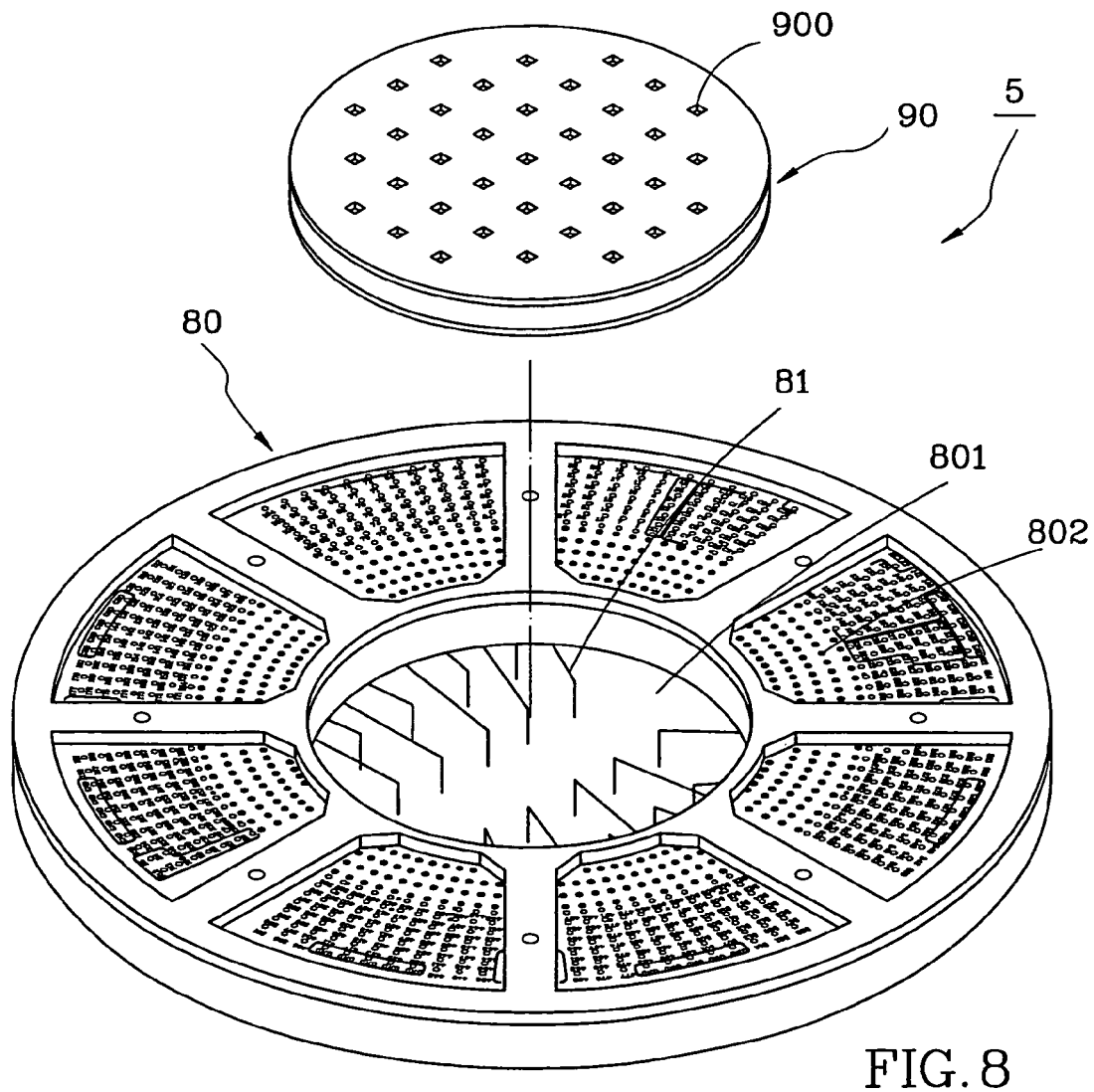
FIG. 8 is an exploded view of a wafer-level test system in accordance with a fourth embodiment of the present invention.

FIG. 8 illustrates a wafer-level test system 5 according to a fourth embodiment of the present invention. According to this embodiment, the wafer-level test system 5 is comprised of a probe card 80 and a test module 90 for a wafer-level test on multiple image sensor chips of an integrated circuit wafer.

The probe card 80 has a detection zone 801 and a circuit zone 802. The detection zone 801 is a center opening of the probe card 80, having a size about one fourth of the area of the wafer structure. The circuit zone 802 has electronic circuits arranged thereon, and a plurality of probes 81 suspending beneath the detection zone 801. The probes 81 are perfect conductors controllable to move by a fine adjustment mechanism and to contact the image sensor chips of the integrated circuit wafer to be tested, thereby electrically connecting the electronic circuits of the circuit zone 802 to the image sensor chips.

The test module 90 is installed in the detection zone 801, having a plurality of optical test devices 900. The optical test devices 900 have the same functional structure and the equivalent applications as the optical test devices 2*a* of the aforesaid first embodiment shown in FIG. 5. Therefore, no further detailed description in this regard is necessary.

Figure 9:
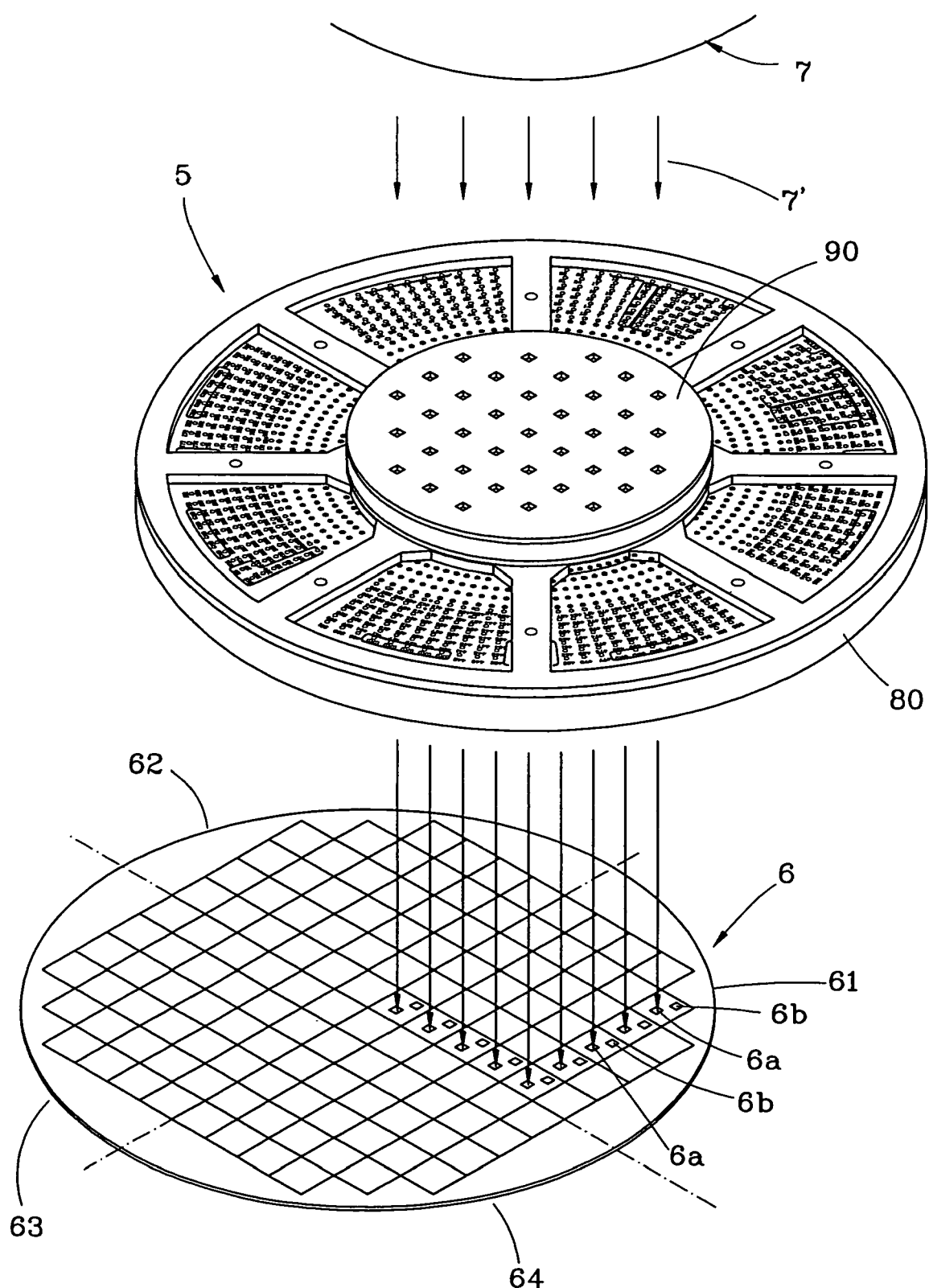
FIG. 9 is a schematic drawing illustrating an application example of the wafer-level test system according to the fourth embodiment of the present invention.

During installation of the wafer-level test system 5, the test module 90 proceeds accurate alignment with the image sensor chips of the integrated circuit wafer. The wafer alignment procedure similar to the aforesaid various embodiments of the present invention is used with the device architecture in FIG. 9 to make a wafer-level test procedure for testing every image sensor chip on the integrated circuit wafer. The test procedure of the wafer-level test system 5 includes the steps of:

a) prepare an integrated circuit wafer 6 having a plurality of image sensor chips wherein each image sensor chip comprises an image capturing device 6a electrically connected to at least one test pad 6b of the respective image sensor chip;

b) put the wafer-level test system 5 above the integrated circuit wafer 6 to aim the test module 90 at one sector block 61 of a quarter of the integrated circuit wafer 6;

c) provide a test light 7 to project collimated light 7' of a predetermined visible wavelength onto the test module 90 from the top side above the wafer-level test system 5, wherein the collimated light 7' has filtered as a relatively narrower frequency range that lowers the influence of chromatic aberration when passing through the optical lenses 34 of the test module 90, also it makes a precise optical calibration to focus the collimated light 7' after passing through the optical lenses 34;

d) vertically adjust the distance between the planar axis of the optical lenses 34 of the test module 90 and the wafer plane of the integrated circuit wafer 6 to be approximately equal to the focal distance of the optical lenses 34;

e) horizontally aligning the wafer-level test system 5 with the integrated circuit wafer 6 to let the optical lenses 34 focus the collimated light 7' on the respective image capturing devices 6a;

f) fine adjust the vertical distance between the wafer-level test system 5 and the integrated circuit wafer 6, obtaining the best clearness of the projected image on the image capturing devices 6a within the projecting range of the collimated light 7';

g) adjust the probes 81 of the probe card 80 to respectively electrically contact with the test pads 6 of the projected image capturing devices 6a;

h) connect the electronic circuits of the probe card 80 to a test machine for enabling the test machine to receive photo-electrical signals from the respective image capturing devices 6a so as to finish the wafer-level test on the image capturing devices 6a in the sector block 61 of the integrated circuit wafer 6;

i) next move the integrated circuit wafer 6 horizontally to let the test module 90 be aimed at a sector block 62 of another quarter of the integrated circuit wafer 6, and then repeat steps c) through h) to finish the wafer-level test on the image sensor chips 6 in the second sector block 62 of the integrated circuit wafer 6;

j) repeat step i) twice to fully finish the wafer-level test on the residual image sensor chip s 6 in the other two sector blocks 63 and 64 of the integrated circuit wafer 6.

Therefore, the wafer-level test system 5 of the present invention can make a complete wafer-level test on multiple image sensor chips of an integrated circuit wafer accurately and rapidly only after few times of calibration. Further, the test module 90 of the wafer-level test system 5 is not limited to the size corresponding to the detection zone 801 of the probe card 80, i.e., the number of the optical test devices 900 of the test module 90 is not limited to the arrangement of the aforesaid fourth embodiment of the present invention. Therefore, the wafer-level test procedure is not limited to repeating the calibration for four times. Adjusting the layout configuration of the electronic circuits of the probe card 80 allows adjustment of the number of the optical test devices 900 installed within the detection zone 801 to be equal to the number of the image capturing devices 6a, then achieving the wafer-level test procedure only once by the aforesaid steps c) through h).

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A method of fabricating a wafer-level test module for testing multiple image sensor chips of an integrated circuit wafer, said wafer-level test module comprising a base layer, an optical layer, and a cover layer, the method comprising the steps of:

a) preparing a first wafer and making multiple first apertures on said first wafer to form a base layer, the pitch of said first apertures being equal to the pitch of two adjacent image sensor chips of said integrated circuit wafer;

b) preparing a second wafer and making multiple through holes on said second wafer corresponding to said first apertures on said first wafers;

c) preparing multiple optical lenses each having an outer diameter equal to the diameter of said through holes on said second wafer, and mounting said optical lenses in said through holes respectively to keep the optical axes of said optical lenses in vertical relative to the wafer plane of said second wafer and to let the optical axes of said optical lenses pass through the centers of said through holes respectively so as to form an optical layer;

d) preparing a third wafer and making a plurality of second apertures on said third wafer corresponding to said first apertures to form a cover layer; and e) stacking said base layer, said optical layer and said cover layer on one another to let the optical axes of said optical lenses pass through said first apertures and said second apertures.

2. The method as claimed in claim 1, wherein said first wafer, said second wafer and said third wafer are prepared from a semiconductor silicon material.

3. The method as claimed in claim 1, wherein the diameter of said through holes is greater than the diameter of said first apertures.

4. The method as claimed in claim 3, further comprising a substep after step b) to provide a spacer layer in said through holes corresponding to periphery of each of said first apertures for supporting said optical lenses in said through holes during step c), said spacer layer having a thickness smaller than the thickness of said second wafer.

5. The method as claimed in claim 4, wherein said spacer layer is formed of an adhesive substance containing multiple spacer particles, the diameter of said spacer particles being the thickness of said spacer layer.

* * * * *